United States Patent [19]

Barber et al.

[11] 3,943,438

[45] Mar. 9, 1976

[54] APPARATUS FOR TESTING A HERMETIC SEAL IN A GLASS CATHODE RAY TUBE

[75] Inventors: Howard H. Barber; Thaddeus J. Hajduk, both of Chicago, Ill.

[73] Assignee: Zenith Radio Corporation, Chicago, Ill.

[22] Filed: Nov. 18, 1974

[21] Appl. No.: 524,609

[52] U.S. Cl. .............................. 324/54; 324/20 CR

[51] Int. Cl.[2] .................. G01R 31/12; G01R 31/16; G01R 31/22; H01J 9/42

[58] Field of Search .......................... 324/54, 20 CR

[56] References Cited

UNITED STATES PATENTS

| | | | |
|---|---|---|---|
| 2,445,808 | 7/1948 | Stenstrom | 324/54 |
| 2,471,560 | 5/1949 | Everson et al. | 324/54 |
| 2,573,815 | 11/1951 | Smith | 324/54 X |
| 2,866,156 | 12/1958 | Lane | 324/54 |
| 2,900,597 | 8/1959 | Gooding | 324/54 |
| 3,015,692 | 1/1962 | Herrington | 324/20 C |
| 3,069,620 | 12/1962 | Servos | 324/54 |
| 3,417,327 | 12/1968 | Breidenbach | 324/54 |

*Primary Examiner*—Gerard R. Strecker

[57] ABSTRACT

For use in the manufacture of a cathode ray tube, an apparatus for testing a hermetic, glass-like frit seal interposed between the funnel and faceplate of an in-process cathode ray tube. The inside walls of the funnel have a conductive coating adapted to receive test voltage which is applied to an anode button located on the wall of the funnel. A discontinuity in the hermetic seal causes a high voltage breakdown in the seal when the test voltage is applied to the cathode ray tube. The apparatus comprises an elastomeric band which is capable of being stretched over the tube, conforming to the shape of the hermetic seal between the funnel and faceplate. It further includes means for supporting and locating the cathode ray tube in a position such that the tube may be tested. The apparatus also comprises band mounting means which hold the elastomeric band and stretch the band to fit around the tube's hermetic seal such that the band forms intimate and uninterrupted electrical and mechanical contact with the frit seal. The apparatus further comprises means for applying a test voltage across the frit seal between the conductive coating and the elastomeric band. A method for testing the frit seal of a cathode ray tube is also disclosed.

5 Claims, 7 Drawing Figures

FIG. 1
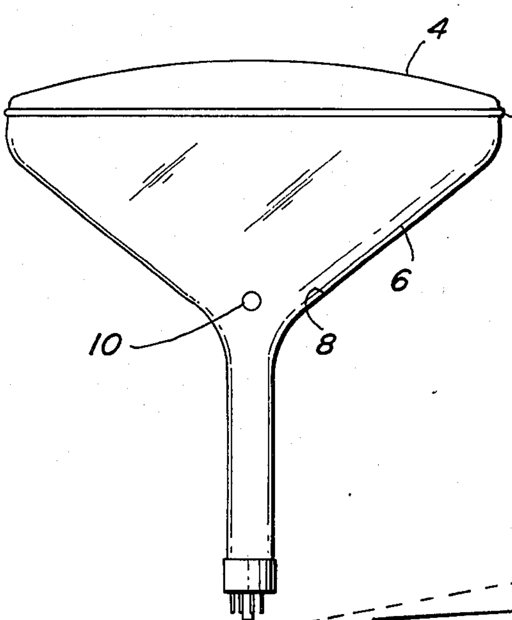
FIG. 4B
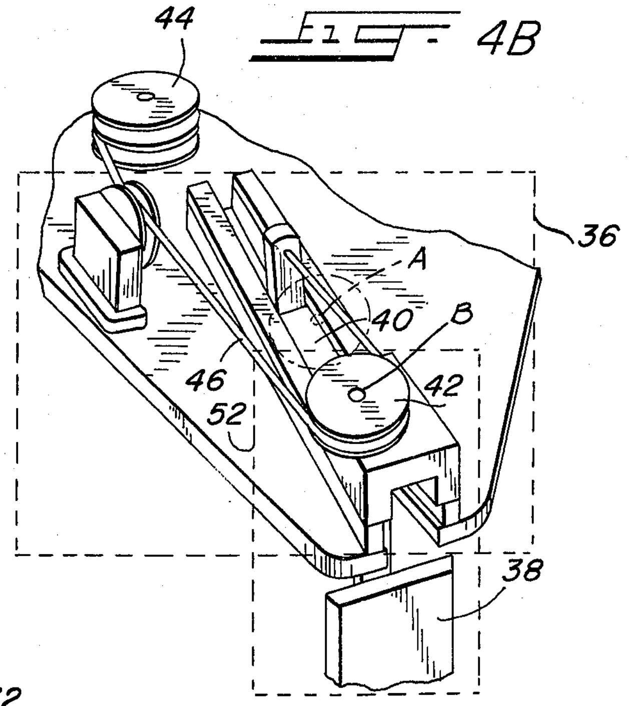
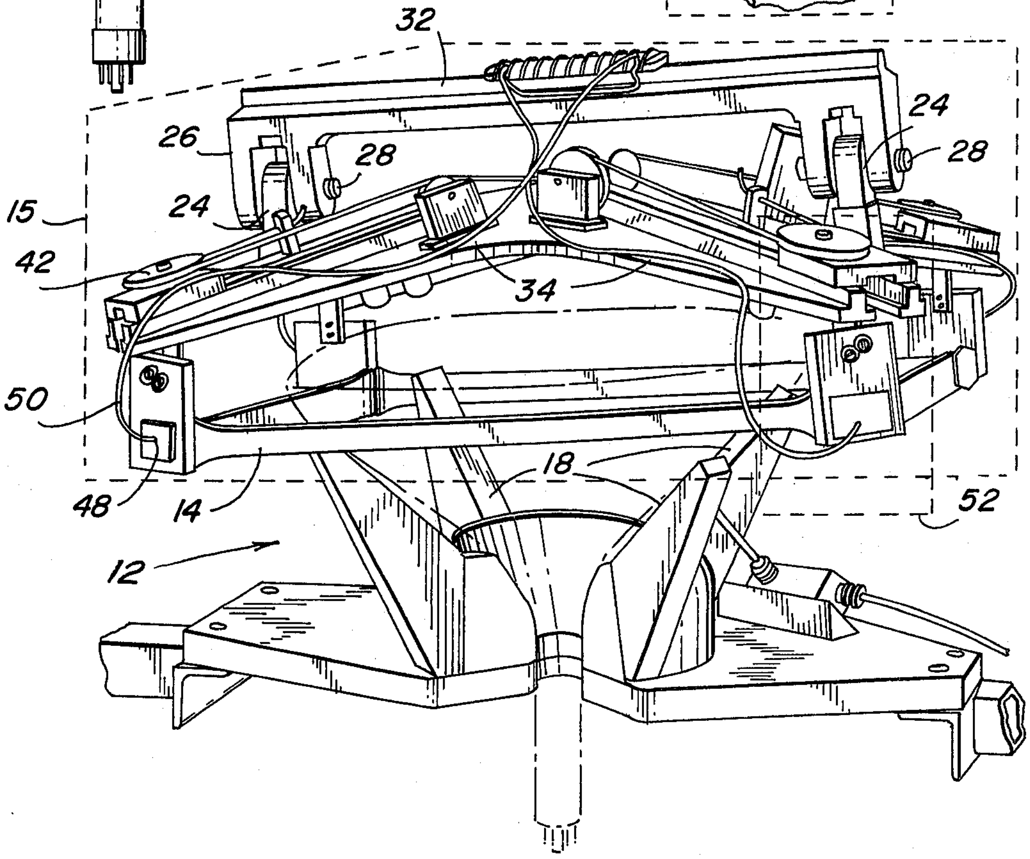
FIG. 2

APPARATUS FOR TESTING A HERMETIC SEAL IN A GLASS CATHODE RAY TUBE

BACKGROUND OF THE INVENTION

This invention relates to the manufacture of cathode ray tubes for television receivers. The invention is embodied in an apparatus for testing the hermetic qualities of the seal between the front panel and funnel of the cathode ray tube, commonly termed the "frit" seal.

Prior art methods of testing the hermetic qualities of the seal utilize a standard fixture designed for an individual sized cathode ray tube. One limitation with the standard fixture is that only one size tube may be tested in each particular fixture, requiring multiple fixtures to accommodate the variety of tube sizes contemporaneously manufactured in the manufacturing process. An operator physically sets each tube to be tested face down upon the standard fixture and releases linkage allowing a spring-like device to close in around the frit seal and substantially contact the frit for the duration of the test. Prior art methods utilize a flat spring or a wire gauze "Brillo pad"-type structure in the fixture.

The test voltage is applied to the anode of the cathode ray tube. The spring or gauze serves as the ground completing the test circuit. Any defect or break in the seal will cause a breakdown through the seal to transfer current to the grounded wire gauze or flat spring surrounding the seal. The flat spring or wire gauze apparatus is limited in that the contact established with the seal around the entire periphery of the cathode ray tube is interrupted due to the qualities of the spring or gauze-type structure. Neither are sufficiently flexible to contact the frit seal at all points around the tube. At any point around the tube whre the frit seal does not contact the spring or gauze structure, the seal is not being tested and the possibility of a defective seal being passed by the test method is enhanced.

OBJECTS OF THE INVENTION

It is a general object of the invention to provide improved method and apparatus for testing a cathode ray tube.

More specifically, it is an object of the invention to provide new and improved method and apparatus for testing the hermetic seal between the faceplate and funnel of a cathode ray tube.

Another object is to provide an improved device for making contact with the hermetic seal on a cathode ray tube during the testing of the seal.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 1 is a side view of a typical color cathode ray tube;

FIG. 2 is a perspective view of cradle and handfinger-like structure of cathode ray tube test apparatus constructed according to this invention;

FIG. 4B is a fragmentary, perspective view of one part of the hand-like structure shown in FIG. 4A

DESCRIPTION OF THE PREFERRED EMBODIMENT

Figure 3:
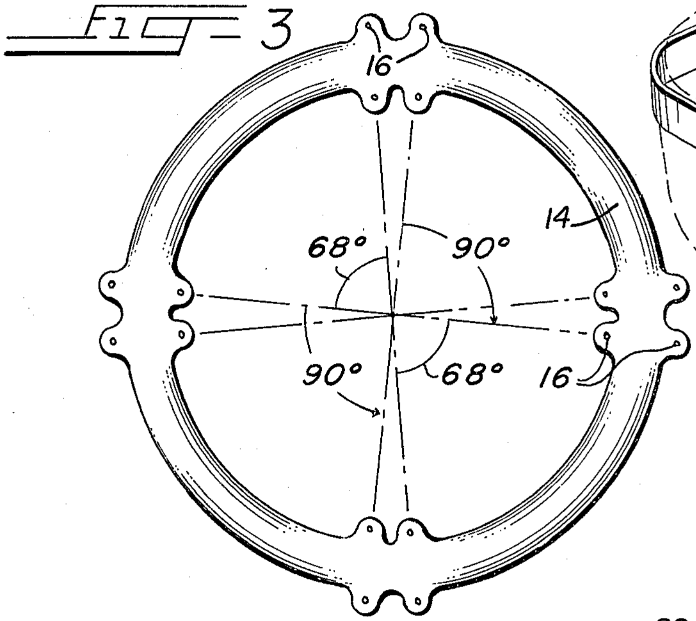
FIG. 3 is a top view of an elastomeric band constituting an important part of the FIG. 2 apparatus.

In the manufacture of cathode ray tubes, a hermetic, glass-like ("frit") seal 2 is established on the interface of the cathode ray tube faceplate 4 and funnel 6. See FIG. 1. For the cathode ray tube to perform, it is imperative that the hermetic integrity of the frit seal be maintained. The inner walls of the funnel 6 are coated with a conductive coating 8 which carries a high voltage during the operation of the tube. The voltage is applied to an anode button 10, which is positioned on one wall of the funnel and coupled to the conductive coating.

The invention provides means for supporting the cathode ray tube in a position which will be suitable to test the hermetic integrity of the frit seal. A typical supporting device is shown in FIG. 2 wherein a cradle 12 preferably designed to accept all sizes of cathode ray tubes is used to support the cathode ray tube during the test. The support surfaces 18 of the cradle 12 used in the preferred embodiment function as bumpers for the funnel of the cathode ray tube to prevent tube damage in the loading and testing operations. Preferably at least one of the bumpers has a sensor (not shown) to sense the presence or absence of a tube in the supporting cradle. In the preferred embodiment, the cradle 12 is fixed, having one set of standards to accommodate the various size cathode ray tubes although clearly it may be designed to adjust to each individual sized tube. Once the tube to be tested is adequately suppoted, an electrically conductive elastomeric band 14 is placed around the frit seal 2, preferably being capable of conforming to the shape of and establishing continuous mechanical and electrical contact with the frit seal around the perimeter of the cathode ray tube.

The integrity of the seal is generally tested by applying a high voltage across the seal. Preferably a 40–50 KV source is coupled to the cathode ray tube's anode for approximately 27 seconds, of a shorter period of time if there is a high voltage breakdown in the seal.

In the system employed in the preferred embodiment, if the hermetic integrity of the seal fails, essentially a high voltage breakdown occurs across the seal, causing current to flow through a meter relay, coupled between the electrically conductive elastomeric band and ground, through the effectively grounded elastomeric band, through the discontinuity in the frit seal to the high voltage power supply. The high voltage breakdown, thus the current flow through the meter, energizes the appropriate circuitry to shut off the high voltage power supply. If the hermetic integrity of the seal sustains the high voltage test, a timer on the high voltage power supply is activated and the appropriate circuitry causes de-energization and a shutting off of the high voltage power supply.

After the integrity of the seal has been determined, the elastomeric band around the frit seal is removed and the tested cathode ray tube is removed from the supporting means.

In the preferred embodiment of the invention, the elastomeric band's conductive properties comprises an impregnation of graphite making the band a suitable conductor of electric current. FIG. 3 shows the basic configuration of the elastomeric band 14 used in the preferred embodiment. The band is substantially circular in shape as shown in FIG. 3 and substantially oval in its cross-section dimension, being approximately 14 ⅝ inches in diameter, 2 ½ inches wide and approximately 1/16 inch thick. On the substantially circular band, utilized in the preferred embodiment, are juxtapositioned four ear lugs 16, each having a predetermined position around the perimeter of the band 14, for coupling the band 14 to a band mounting means (to be described). It is preferable that the relative positions of the ear lugs correspond to the respective minor and major axes of a typically rectangular cathode ray tube faceplate.

FIG. 3 shows the ear lugs 16 corresponding to the minor axis of the faceplate closer together than the ear lugs corresponding to the major axis of the faceplate. From the geometric center of the circlar band the ear lugs corresponding to the minor axis are approximately 68° apart and the ear lugs corresponding to the major axis are approximately 90° apart. Although the preferred embodiment is designed basically for a series of various sized rectangular shaped cathode ray tubes, the band 14 may be utilized equally as well with a circular or even a square faced cathode ray tube. It is preferable that the elastic properties of the band 14 permit it to be stretched over the tube and the frit seal so as to conform to the frit seal and establish continuous intimate mechanical and electrical contact with the seal.

Figure 4C:
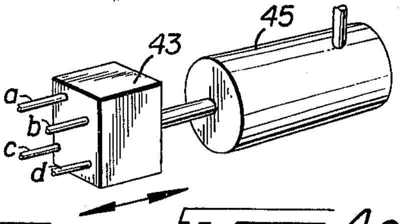
FIG. 4C is a fragmentary perspective view of groups of pulleys actuated by an air cylinder.
Figure 4A:
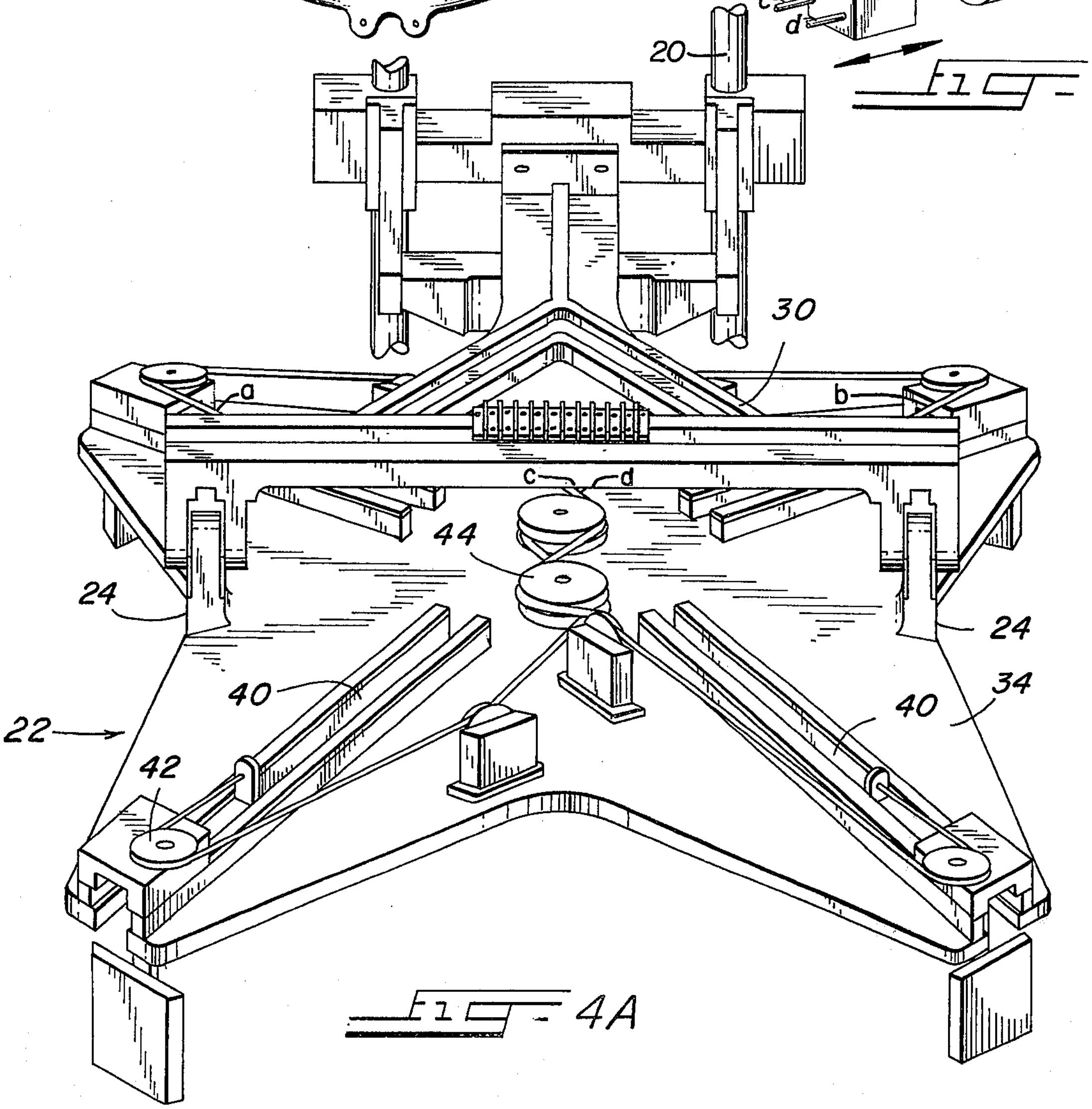
FIG. 4A is a partial top perspective view of the hand-like structure shown in FIG. 2.

The band mounting means 15 illustrated within the dotted line in FIG. 2 and further particularized in FIG. 4A holds, stretches and elevates the elastomeric band 14. In the preferred embodiment, the band mounting means includes a handfinger-like structure 22, hereafter referred to as structure 22, which may be cantilevered from an elevating means and which may include ball bearing-type slides 20 for holding and stretching the elastomeric band as the hand is elevated. The structure 22 may be designed to accommodate cathode ray tube faceplates of varying sizes by establishing a dome-shaped hand-like structure 34, hereafter referred to as the hand 34, having a predetermined slope from the top to the outer edges of the dome, FIG. 4B. In the preferred embodiment, a 15° top to edge slope was found to provide an adequate slope to the hand to accommodate various size cathode ray tubes.

In the preferred embodiment, the structure 22 is coupled through lugs 24 to a support bracket 26 which may be cantilevered from the slides 20. Between the lugs 24 on the support bracket 26 the preferred embodiment establishes a pivoting means 28 for pivoting the hand 34 around the pitch axis. The pitch axis is the axis normal to the cantilevered portion 30 of support bracket 26, and parallel to the cross member portion 32 of the support bracket 26 which extends across the top of the hand 34. In turn, the entire support bracket 26 along with the coupled structure 22 may pivot on the roll axis (not shown) which is parallel to the cantilevered section 30 of the support bracket 26.

The capability of pivoting around the pitch and roll axes, i.e., the gimbal freedom, allows the structure 22 to ascertain and align itself with the attitude of the faceplate on the supported cathode ray tube. In addition to pivoting capabilities, the structure 22 by virtue of the elevating means, may move vertically relative to the cradle supporting means 12, effectively coming to rest on the faceplate of a cathode ray tube positioned in the support cradle 12. The hand 34 of structure 22 may have sensor elements (not shown), positioned on the underside of the domed hands 34 that sense the structure's contact with the faceplate, effectively arresting the downward motion of the structure 22.

The structure 22 in FIG. 4A includes four identical parts, one of which is depicted in FIG. 4B. In describing one portion of the structure 22, it is to be noted that the other three parts of the structure are similarly constructed and operate in a similar manner. As displayed in FIG. 4B, section 36 of the hand 34 may have coupled to it and extending from the corner of the section a finger-like structure 38, hereafter referred to as a finger, which acts as an insulating buffer between the electrically conductive band 14 and the hand 34. The elastomeric band may be mounted by its ear lugs 16 to the finger 38 by means of common fasteners.

As shown in FIG. 4B, the movable finger 38 and a fixed pulley 42 are coupled by the cable 46 and respectively juxtapositioned on the bottom and top of the hand. The hand 34 has a slotted opening 40 from the periphery to the center of the hand along which the finger 38 may move. In the preferred embodiment center pulleys 44 are located on the top of the domed hand as shown in FIGS. 4A and 4B. They serve a common function to the four corners of the hand, i.e., to the four pulley-finger combinations. In the preferred embodiment, a cable couples pulley 42, center pulleys 44, a group of pulleys located in the back of the apparatus 43 and an air cylinder 45 (see FIG. 4C) to control the movement and position of the finger 38 along the slot 40.

The tension applied on the cables 46 should be commensurate with the amount of stretching the elastomeric band 14 must undergo prior to being placed around the frit seal. When the band is in a relaxed state, the finger 38 52 is at point A, see FIG. 4B, along the slotted opening 40. When fully expanded, which is prior to being placed around a cathode ray tube frit seal, the finger 38 is at point B along the slotted opening. The position of the finger 38 during the testing of a cathode ray tube frit seal is dependent upon the size of the cathode ray tube being tested. For example, if a large tube is being tested, the finger 38 is positioned at a point further away from center pulleys 44 than if a small tube is being tested, i.e., the smaller the tube, the closer to the center of the hand the finger is positioned.

The finger 38 in FIG. 4B which forms the insulating buffer, has an electrical connection 48 to which is connected electrical lead 50. The preferred embodiment provides a power supply source to apply the test voltage to the anode of the cathode ray tube. The electrical leads to connection 48 on the finger 38 are grounded completing the circuitry for the testing apparatus.

The preferred method embodying the invention provides a means for placing a cathode ray tube to be tested onto the supporting cradle 12 thereby defining the basic position and location of the tube. The sensor located in the cradle senses the presence or absence of a tube and energizes the appropriate circuitry to commence the testing procedure. The high voltage test lead is attached to the anode on the conductive coated wall of the cathode ray tube funnel. The hand-finger-like structure 22 which is in its highest upward position when a test is not in process, is energized and commences its vertical downward movement which is arrested when the sensor buttons on the underside of the domed hand contact the faceplate of the supported cathode ray tube. The gimbal freedom established in the hand-finger structure 22 lets the structure 22 ascertain the attitude of the cathode ray tube faceplate.

During the time the band is not in contact with a tube, the finger 38 is fully extended thereby stretching the band a sufficient amount to allow the band to wrap around the large size tubes. After the structure is resting on the faceplate, the four-fingers, by means of the cable and pulley system, are energized and in combination with the elastic properties of the band, effect intimate mechanical and electrical contact between the band and the frit seal of the cathode ray tube. Once intimate contact is established, energization of the high voltage power supply establishes the high voltage application across the frit seal.

A discontinuity occurring or existing in the frit seal, effects a current flow from ground through a meter relay, through the electrically conductive elastomeric band, through the discontinuity in the frit to the high voltage power supply. The meter current energizes the appropriate circuitry to shut off the high power voltage supply, contemporaneously energizing the cable-pulley mechanism effecting the movement of the pulleyfinger combination which stretches the elastomeric band, causing it to break with the cathode ray tube frit seal. If there is no high voltage breakdown of the frit seal after approximately 27 seconds of applying the appropriate test voltage, usually 40–50 thousand volts, the appropriate circuitry is energized shutting off the high voltage power supply. The hand-finger-like structure 22 is then activated, stretching the band from around the seal. The elevating means then lifts the structure 22 vertically away from the supported cathode ray tube which may then be removed from the supporting cradle.

The apparatus as described may be duplicated and placed on a rotor, merry-go-round-type mechanism, to provide as many test stations as desired. Each of the test stations would oerate in a similar manner as described hereinabove. Alternative embodiments may have test stations comprising hangers from an overhead conveyor instead of the cradle disclosed in the preferred embodiment. The conveyor-hanger support system may be cammed to mesh the transported tube with the rotating test apparatus thereby providing a totally automated system.

Figure 3A:
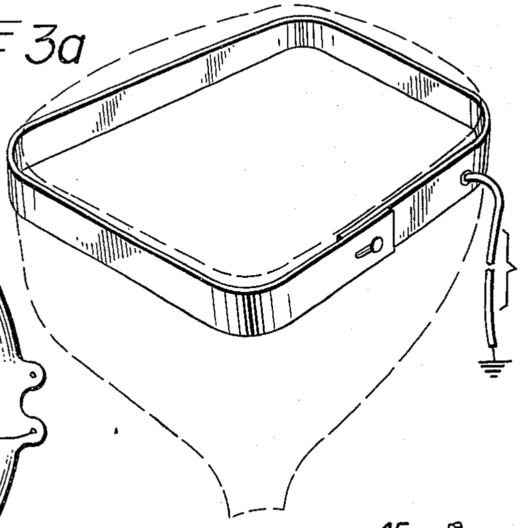
FIG. 3A is a perspective view of a discontinuous elastomeric band in situ.

The invention is not limited to the particular details of construction of the embodiment depicted and other modifications and applications are contemplated. For example, whereas the elastomeric band, in its preferred configuration is a continuous loop, alternatively the elastomeric band may comprise a discontinuous piece of elastomeric material, see FIG. 3A, having fastening means on each end thereof. To make intimate mechanical and electrical engagement with the tube's frit seal, the band is stretched around the frit seal such that the ends of the band overlap, in which state the ends are secured by the fastening means. Certain changes may be made in the above-described method and apparatus without departing from the true spirit and scope of the invention herein involved. It is intended that the subject matter in the above depiction shall be interpreted as illustrative and not in a limiting sense.

What is claimed is:

1. For use in the manufacture of a cathode ray tube an apparatus for testing a hermetic, glass-like, frit seal between the funnel and the faceplate of an in-process cathode ray tube wherein the inside of said funnel has a conductive coating adapted to receive a test voltage applied to an anode button on a wall of said funnel, and wherein a discontinuity in the hermetic seal causes a high voltage breakdown in the seal, said apparatus comprising:

an electrically conductive elastomeric band capable of being stretched over the tube so as to conform to said hermetic seal between said funnel and faceplate;

means for supporting and locating said cathode ray tube in a position to be tested;

band mounting means for holding said elastomeric band and for stretching said elastomeric band to a rectangular stretched configuration larger than the size of the faceplate of the tube to be tested, and for relaxing the band such that it makes a static fit around hermetic seal on said tube and conforms intimately to said seal to make an uninterrupted electrical and mechanical engagement therewith; and means for applying a test voltage across the hermetic seal of said cathode ray tube between said conductive coating and said band.

2. An apparatus in accordance with claim 1 wherein said elastomeric band is a discontinuous piece of elastomeric material having fastening means on each end thereof, whereby when stretched around said frit seal said ends overlap, conforming said band to the shape of said frit seal establishing continuous mechanical and electrical contact between said band and seal.

3. An apparatus in accordance with claim 1 wherein said elastomeric band is a continuous piece of elastomeric material having a substantially circular shape and oval cross-section capable of conforming to and establishing intimate mechanical and electrical contact with the peripheral portion of said frit seal protruding from said funnel and faceplate interface.

4. An apparatus in accordance with claim 1 wherein said band mounting means comprises an elevating means and a cantilevered hand and finger-like structure coupled to said elevating means, the fingers of said structure for stretching and relaxing said elastomeric band.

5. An apparatus in accordance with claim 4 wherein said fingers are for producing relative movement with respect to said hand-like structure, coupling said elastomeric band to said hand-like structure, whereby on relative movement said fingers stretch or relax said band to fit around the frit seal on a predetermined size, in-process cathode ray tube.

* * * * *